(12) United States Patent  
Lane et al.

(10) Patent No.: US 6,812,143 B2
(45) Date of Patent: Nov. 2, 2004

(54) PROCESS OF FORMING COPPER STRUCTURES

(75) Inventors: Michael Lane, Cortlandt Manor, NY (US); Fenton Read McFeely, Ossining, NY (US); Conal Murray, Yorktown Heights, NY (US); Robert Rosenberg, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 10/279,057

(22) Filed: Oct. 24, 2002

(65) Prior Publication Data

US 2003/0203617 A1 Oct. 30, 2003

Related U.S. Application Data

(63) Continuation-in-part of application No. 10/132,173, filed on Apr. 26, 2002.

(51) Int. Cl.$^7$ .............................................. H01L 21/44
(52) U.S. Cl. ..................... 438/643; 438/653; 438/656; 438/678; 438/687
(58) Field of Search ................... 438/643, 653, 438/656, 678, 687, 627, 648, 650, 685, 686

(56) References Cited

U.S. PATENT DOCUMENTS

| | | | | |
|---|---|---|---|---|
| 4,767,661 A | * | 8/1988 | Battey et al. | 428/209 |
| 5,969,422 A | * | 10/1999 | Ting et al. | 257/762 |
| 6,440,854 B1 | * | 8/2002 | Rozbicki | 438/687 |
| 6,441,492 B1 | * | 8/2002 | Cunningham | 257/762 |
| 2002/0053741 A1 | * | 5/2002 | Iwasaki et al. | 257/762 |
| 2003/0030088 A1 | * | 2/2003 | Kumagai et al. | 257/296 |

* cited by examiner

*Primary Examiner*—T. N. Quach
(74) *Attorney, Agent, or Firm*—Connolly Bove Lodge & Hutz LLP (57) ABSTRACT

The barrier material of the invention provides for the electrodeposition of copper. The barrier layer includes a dielectric interface surface region, and a copper interface surface region with at least 50 atom percent of a copper interface metal. In particular, the barrier layer of the invention provides for the electrodeposition of copper or copper alloy directly onto the copper interface region of the barrier layer in a direct electrodeposition process. The process includes providing a dielectric layer disposed on an underlayer, contacting a barrier layer to the dielectric layer, and depositing a conducting layer onto the barrier layer.

15 Claims, 4 Drawing Sheets

PROCESS OF FORMING COPPER STRUCTURES

RELATED APPLICATIONS

This application is a Continuation-in-Part Application and claims priority to U.S. patent application Ser. No. 10/132,173, filed Apr. 26, 2002, entitled "A Barrier Material For Copper Structures", the entire disclosure of which is incorporated herein by reference.

FIELD OF THE INVENTION

The invention is directed to a method of depositing copper to form copper structures, particularly copper structures used in semiconductor devices. The invention is also directed to a barrier material and the method of making the same. The barrier material can be used as a barrier layer in integrated circuit structures.

BACKGROUND OF THE INVENTION

In damascene processing, the interconnect structure or wiring pattern is formed within grooves or other openings formed within a dielectric film. Using known techniques a photoresist material is used to define the wiring pattern. The patterned photoresist acts as a mask through which a pattern of the dielectric material is removed by a subtractive etch process such as plasma etching or reactive ion etching. The etched openings are used to define wiring patterns in the dielectric layer. These wiring patterns can extend from one surface of the dielectric layer to the other surface of the dielectric layer. Alternatively, the wiring patterns can be confined to a single layer, that is, not extend to the opposite surface of the dielectric layer. The wiring patterns are then filled with a metal using a filling technique such as electroplating, electroless plating, chemical vapor deposition, physical vapor deposition or a combination thereof. Excess metal can then be removed by chemical mechanical polishing through a process known as planarization.

In the single damascene process, via openings are provided in the dielectric layer and filled with a conducting metal, which is often referred to as metallization, to provide electrical contact between layers of wiring levels. In the dual damascene process, the via openings and the wiring pattern openings are both provided in the dielectric layer before filling with the conducting metal. The dual damascene process can simplify the manufacturing process by eliminating some internal interfaces. Damascene processing followed by metallization is continued for each layer in the electronic component until the electronic device is completed.

Metals are utilized for a variety of applications in semiconductor chips. One such application includes using metals as interconnect structures. One way of forming interconnect structures is electroplating the conducting metal on to semiconductor structures. Recently, copper has started to replace aluminum in interconnect structures in integrated circuit chips. Replacement of aluminum with copper stems at least in part from the lower electrical resistivity of copper. As a result, utilizing copper has resulted in an improvement in IC chip performance. These advantages are described by Luther et al., Proceedings of the 10th International IEEE VLSI Multilevel Interconnection Conference, 1993, p. 15; and by Edelstein, Proceedings of the 12th International IEEE VLSI Multilevel Interconnection Conference, 1995, p. 301.

One method that may be utilized to deposit copper for chip interconnect structures is the damascene method. See, U.S. Pat. No. 5,612,254, the entire contents of the disclosure of which are incorporated herein by reference. Typically, copper is electroplated to form the structures, as described by Andricacos et al., IBM J. Res. Develop., 42, 567 (1998). Electroplating and the damascene method provide a lower cost versatile method for making copper interconnects.

Electroplated damascene technology begins with the deposition on a semiconductor wafer and patterning of dielectric material. Next, a barrier material is deposited over an entire surface of the wafer including the dielectric material and any underlying portions of the semiconductor wafer exposed by the patterning. The barrier material serves to isolate the silicon circuitry formed in and on the semiconductor wafer from the copper interconnects.

Barrier layer films are needed between the dielectric material and the conductive material in order to prevent atoms of the conductive material from migrating into and at times through the dielectric material and into other active circuit device structures. Migration of conductive material in the device can cause inter-level or intra-level shorts through the dielectric material. Also, junction leakage may result, and threshold voltage ($V_t$) levels of the transistors formed within the substrate can shift. In some cases, device functionality can be destroyed.

Migration is a particular concern if copper is used as the interconnect material because copper exhibits relatively high mobility in materials used in semiconductor structures. Yet, in spite of this problem, copper is a favored material for interconnect structures because of its superior conductivity. As a result, if copper is used as an interconnect structures, the copper needs to be confined with a barrier layer.

A barrier material conventionally used in conjunction with copper interconnect structures, is tantalum (Ta) and tantalum nitride (TaN). However, because these barrier materials are more reactive than copper, the formation of contaminating interfacial oxides can result in poor adhesion properties between the deposited copper layer and the barrier material. Due to the presence of the contaminating oxides, these conventional barrier materials usually require the deposition of a Cu seed layer prior to standard Cu electrodeposition in a Cu acid bath.

Other materials that can be used as barrier layer materials in conjunction with copper also exhibit shortcomings. For example, titanium nitride also exhibits poor atomic matching on certain atomic planes along the interface it forms with copper. Also, titanium is generally considered unsuitable for use as a barrier material, because titanium combines with copper to form an inter-metallic compound which lowers the conductivity of the copper film. As a result there is a need for new barrier layer materials that exhibit minimal oxide formation, and improved atomic matching.

Following the deposition of barrier material, a thin conducting layer, generally referred to as a "seed" layer is deposited over the barrier material. This seed layer acts to carry the electrical current for the electroplating process. Although the seed layer can include any conducting metal(s) or metal alloy(s), typically, the seed layer contains copper.

Following the deposition of a seed layer, the metal to make up the interconnect structure can be electrodeposited over the entire surface of the wafer, filling the patterns of lines and vias in the dielectric and simultaneously forming an "overburden" on the top of the dielectric. The overburden can be removed by chemical-mechanical polishing. Electroplating in damascene technologies entails making electrical contact to the seed layer, at one, or preferably, a multiplicity of points at the edge of the substrate. In some kinds of plating tools, the contact area is exposed to the plating solution. Exposure of the seed layer to the plating solution can result in etching of the seed layer, because the plating solution can include very corrosive materials. Any etching of the seed layer the plating bath can imperil the contact and as a result the quality of the electroplated metal.

Furthermore, the ability of electroplating processes to fill damascene patterns, particularly dual damascene patterns, which can have increasingly high aspect ratios as the dimensions of VLSI technology shrink and essentially vertical side walls, is critically dependent on the integrity of the seed layer that carries the plating current. Missing seed layer, whether as a result of problems in deposition or etching by the plating solution can lead to a void in the electroplated metal. Voids in the lines substantially increase their resistance and result in poor reliability.

Still another problem associated with the use of a seed layer is the relative differences in the thickness of the seed layer. In general, the thickness of the seed layer is greatest on top of the dielectric than on the side-walls and bottoms of the lines and vias of a damascene pattern, particularly a dual damascene pattern. Although many advances have been made in the physical vapor deposition techniques, which is typically used to deposit the seed layer, coverage of the seed layer on the sides and bottoms of damascene patterns, and particularly dual damascene patterns, is often marginal. Because the thickness of the seed layer can become progressively less toward the bottom of the via, such relatively thin seed layers are more susceptible to being completely removed when attacked by the plating solution.

Marginal seed layers that are barely continuous after deposition can be further thinned by the formation of a native oxide and by dissolution of the oxide in the acidic plating bath before the initiation of plating. As a result, voids can form in lines, and the performance and reliability of the chip can be unsatisfactory.

As a result of the various disadvantages seed layers can impose on the quality of the electrodeposited metal, there is a need to develop new barrier materials that require only a relatively thin seed layer, or no seed layer at all prior to electrodeposition of the conducting metal. Obviously, one advantage of not requiring a seed layer is the streamlining of the chip manufacturing process.

SUMMARY OF THE INVENTION

The barrier material of the invention provides for the electrodeposition of copper. In particular, the barrier layer of the invention provides for the electrodeposition of copper or copper alloy deposited directly onto the barrier layer in a direct electrodeposition process. The process of the invention includes forming a conducting layer in a semiconductor structure comprising: providing a dielectric layer disposed on an underlayer, providing a barrier layer disposed on the dielectric layer, wherein the barrier layer comprises a dielectric interface surface region, and a copper interface surface with at least 50 atom percent of a copper interface metal; and depositing a conducting layer onto the copper interface surface region of the barrier layer. The conducting layer preferably contains copper or an alloy thereof, and preferably, the conducting layer is deposited by direct electrodeposition.

The process of the invention also includes forming a copper interconnect structure on an electronic device comprising: forming a dielectric layer on an underlayer; forming damascene openings or dual-damascene openings defined by submicron lines in the dielectric layer, wherein the damascene openings or dual-damascene openings have sidewalls and a bottom surface; forming a barrier layer on the sidewalls and the bottom surface, wherein the barrier layer comprises a dielectric interface surface region, and a copper interface surface with at least 50 atom percent of a copper interface metal; depositing a conductor layer containing copper or an alloy thereof by direct electrodeposition; and planarizing the resulting structure to accomplish electrical isolation of interconnect structure.

The invention is also directed to a barrier material. The barrier material is particularly suited for use as a barrier layer in copper interconnect structures found in semiconductor structures. The barrier material of the invention comprises surface regions with one surface region containing at least 50 atom percent of a copper interface metal. The barrier material of the invention can also comprise a gradient concentration of a dielectric interface material and a copper interface metal. The copper interface metal is selected from ruthenium, rhodium, palladium, silver, gold, platinum, iridium, selenium, tellurium, or alloys thereof.

The barrier material also contains a surface region containing at least 50 atom percent of a dielectric interface material. The dielectric interface material is selected from tungsten, tungsten nitride, titanium, titanium nitride, tantalum, and tantalum nitride. Other dielectric interface materials can include alloys containing any combination of titanium, tantalum, tungsten, silicon, and nitrogen. In such applications, a surface region of the barrier material proximate to a dielectric contains at least 50 atom percent of a dielectric interface material, and a surface region of the barrier material proximate to a conducting material contains at least 50 atom percent of a copper interface metal.

The semiconductor structure of the invention comprises a dielectric layer disposed on an underlying layer and a barrier layer disposed on the dielectric layer. The barrier layer contains a dielectric interface material and a copper interface metal. The barrier layer can also include a gradient atomic concentration of a copper interface metal with a relatively high atomic concentration of the copper interface metal proximate to a conducting material. The conducting material preferably contains copper or an alloy thereof.

BRIEF DESCRIPTION OF THE DRAWINGS

The invention will be better understood by reference to the Detailed Description of the Invention when taken together with the attached drawings, wherein.

DETAILED DESCRIPTION OF THE INVENTION

The barrier material of the invention provides for the electrodeposition of copper or an alloy thereof. In particular, the barrier layer of the invention provides for the direct electrodeposition of copper or copper alloy directly onto the barrier layer in a direct electrodeposition process. The process of the invention includes forming a conducting layer in a semiconductor structure comprising: providing a dielectric layer disposed on an underlayer; providing a barrier layer disposed on the dielectric layer, wherein the barrier layer comprises a dielectric interface surface region, and a copper interface surface with at least 50 atom percent of a copper interface metal, and depositing a conducting layer onto the barrier layer. The conducting layer preferably contains copper or an alloy thereof, and preferably, the conducting layer is deposited by electrodeposition.

The present invention finds particularly favorable use in forming semiconductor structures that include damascene structures or dual damascene structures. Furthermore, the present invention provides especially favorable results where the damascene structures comprise high aspect ratio lines and/or vias with dimensions less than about 0.2 microns.

The barrier material of the invention contains a dielectric interface material and a copper interface metal. The copper interface metal is selected from ruthenium, rhodium, palladium, silver, gold, platinum, iridium, selenium, tellurium, and alloys thereof. The barrier material contains two surface regions with one surface region containing at least 50 atom percent, preferably at least 70 atom percent, more preferably at least 90 atom percent, of a copper interface metal. This surface region is referred to as a copper interface surface region.

The barrier material also contains a surface region with at least 50 atom percent, preferably at least 80 atom percent, of a dielectric interface material. This surface region is referred to as a dielectric interface surface region.

The barrier material of the invention can also contain a gradient concentration of a dielectric interface material and a copper interface metal. In this case, the barrier layer will have a region proximate to the dielectric layer with at least 50 atom percent, preferably at least 80 atom percent, of a dielectric interface material. The barrier layer will also have a region proximate to a conducting layer with at least 50 atom percent, preferably at least 70 atom percent, more preferably at least 90 atom percent, of a copper interface metal.

The barrier material can be used as a barrier layer, which is often used in damascene or non-damascene processing applications. The barrier material can provide for direct Cu electrodeposition in standard Cu acid baths used in the microelectronic industry without the need for a seed layer, and particularly, without the need for a copper seed layer. In such applications, the barrier layer will have a region proximate to a dielectric material and an opposite region proximate to a copper structure, particularly a copper interconnect structure.

Figure 1:
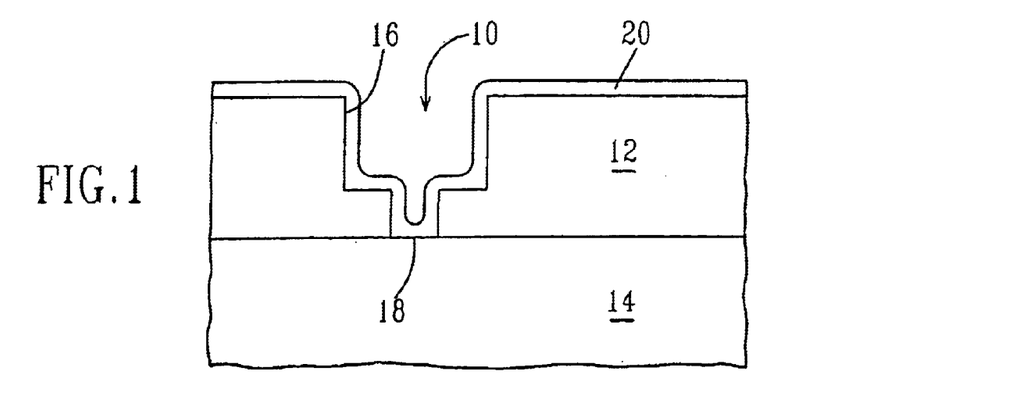
FIG. 1 is a cross-sectional view of a first embodiment of a barrier layer of the invention.

FIG. 1 shows a damascene opening 10 within dielectric layer 12 in contact with underlying layer 14. Underlying layer 14 may be any layer above which dielectric layer 12 is formed. In one embodiment, underlying layer 14 is a substrate material such as a silicon substrate commonly used in the semiconductor processing industry. In another embodiment, underlying layer 14 is a conductive layer wherein opening 10 is used to provide contact between a conductive layer to be formed within opening 10 and the conductive layer below. In another embodiment, underlying layer 14 can be dielectric layer, in which case the cross-section shown in FIG. 1 is a cross-sectional view of a damascene opening formed in a region where contact between two adjacent conductive layers is not made. If underlying layer 14 is a dielectric layer, the underlying layer can be the same as dielectric layer 12 or a second dielectric layer. Dielectric layer 12 can be any suitable dielectric layer used in the semiconductor manufacturing industry such as an oxide, e.g., silicon dioxide, nitride, silicon nitride, or an oxynitride layer. Low-k dielectric materials, e.g., SiLK® from Dow Chemical, Coral® from Novellus, Black Diamond® from Applied Materials and spin-on silicon-based dielectrics, can also be used. Dielectric layer 12 can be formed by any of various methods, including by chemical vapor deposition and spin-on techniques as described in U.S. Pat. Nos. 5,530,293, 5,923,163, 5,320,868 and 5,441,765, the disclosures of which are incorporated herein by reference.

Opening 10 within dielectric layer 12, can be formed using conventional methods known in the semiconductor industry. As shown in FIG. 1, opening 10 is a two-tiered structure commonly referred to as a dual damascene opening. Opening 10 includes sidewalls 16 and bottom surface 18. Bottom surface 18 can be an upper surface of underlying layer 14. Alternatively, bottom surface 18 can be a surface of dielectric layer 12 or as shown, a surface of underlying layer 14. Barrier layer 20 is a barrier layer containing a dielectric interface material and a copper interface metal. Barrier layer 20 is formed on a top surface of dielectric layer 12, and sidewalls 16 and bottom surface 18 of opening 10. As shown, barrier layer 20 does not completely fill opening 10.

It is to be understood that the present invention is not to be limited to structures formed in dual damascene openings. Rather, the opening 10 can have various configurations such as vias, grooves, trenches or single damascene openings. Moreover, the invention is not to be limited to barrier layers disposed in an opening. For example, the barrier layer can be disposed over any structure including a flat planer dielectric layer.

1. Barrier Layer with a Concentration Gradient

Figure 2:
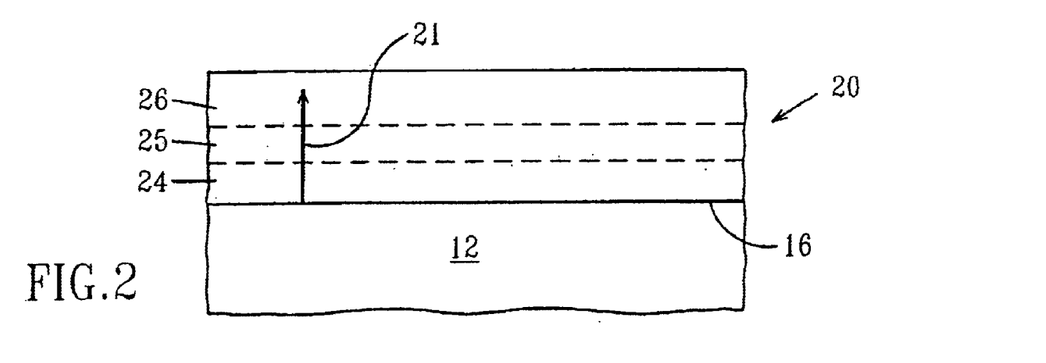
FIG. 2 is an expanded cross-sectional view of the first embodiment of a barrier layer of the invention.

FIG. 2 shows an expanded view of barrier layer 20 in contact with sidewall 16. It is to be understood that the same type of barrier layer described in FIG. 2 to sidewall 16 is also applicable to bottom surface 18. Barrier layer 20 contains a dielectric interface material and a copper interface metal and includes a gradient composition of a copper interface metal or a gradient composition of the dielectric interface material along perpendicular direction 21. Alternatively, barrier layer 20 includes a gradient composition of a copper interface metal and a gradient composition of the dielectric interface material along perpendicular direction 21. As shown, the relative atomic concentration of a dielectric interface material within the barrier layer is preferably at a maximum in a surface region of the barrier layer adjacent to sidewall 16, i.e., proximate to dielectric layer 12, and decreases along perpendicular direction 21. As a result, the atomic percentage of a dielectric interface material in region 24 is greater than that in region 25 which, in turn is greater than that in region 26. Conversely, the total atomic concentration of the copper interface metal within barrier layer 20 can increase along direction 21. As a result, the total atomic concentration of the copper interface metal within barrier layer 20 is preferably at a relative minimum in region 24, is increased in region 25, and is maximized in region 26.

It is to be understood that regions 24, 25 and 26 are arbitrarily chosen to exhibit the gradient of relative atomic concentrations of the copper interface metal or the dielectric interface material within barrier layer 20, and is not intended to limit the barrier layer 20 of the invention to three distinct and distinguishable regions. For example, in one embodiment, the concentration gradient can be a relatively gradual and continuous concentration gradient with no discernable and distinct boundaries between regions.

Barrier layer 20 will have a thickness of from about 0.5 nm to about 100 nm, a thickness from about 1 nm to about 25 nm, or a thickness from about 3 nm to about 15 nm. The thickness of barrier layer 20 depends upon the design specifications for the semiconductor device as well as its application.

One advantage of the barrier layer of the invention is that it exhibits an improved resistance to migration of copper into the dielectric layer. Also, the barrier layer is believed to provide a region that adheres relatively well to copper, and minimizes copper migration from a conducting layer to an adjacent layer. It is believed that the improved adhesion of the barrier layer to the conducting copper layer is achieved by reducing oxygen contamination at the copper/barrier interface. The copper is deposited by such means as electrodeposition, physical vapor deposition (PVD), atomic layer deposition (ALD), or electroless deposition.

In one embodiment of the invention, the barrier layer 20 with a concentration gradient along direction 21 can be formed in a PVD process using a single sputtering target containing the metals of barrier layer 20. The amounts of each respective metal contained in the sputtering target is dependent upon sputtering conditions, the gradient composition desired, and the type(s) of copper interface metals and dielectric interface materials used to form barrier layer 20. Regardless of the composition of the sputtering target, the produced barrier layer 20 has a relatively high atomic concentration of a dielectric interface material at a region proximate to dielectric layer 12, and an opposite region proximate to a copper conducting layer with a relatively high atomic concentration of a copper interface metal.

In another embodiment, the barrier layer 20 with a concentration gradient along direction 21 can be formed in a PVD process using at least two separate sputtering targets. A sputtering target containing a dielectric interface material and a sputtering target containing a copper interface metal are positioned within a deposition chamber. The power supplied to each of the respective targets is separately controlled. The amount of metal sputtered from each target is proportional to the amount of current or power supplied to the sputtering target. As a result, the desired atomic concentrations of the sputtering targets, controlled amounts of each respective target metal(s) are simultaneously sputtered onto the exposed substrate, thus producing a barrier layer containing both a dielectric interface material and a copper interface metal.

A barrier layer of different concentration gradients of a dielectric interface material and a copper interface metal can be produced by varying the relative power, amperage and/or voltage supplied to the sputtering targets. Deposition conditions are chosen so that a greater amount of a dielectric interface material is sputtered onto the exposed surfaces of a dielectric layer than the copper interface metal during the initial stages of the sputtering process. As the sputtering process continues, the power provided to the sputtering targets is adjusted so that relatively more of the copper interface metal is sputtered, and thus the atomic concentration of the copper interface metal increases in the barrier layer. The result of which is a barrier layer with a relatively high atomic concentration of a dielectric interface material in a region proximate to the dielectric layer. Conversely, the barrier layer has a relatively low atomic concentration of a copper interface metal in a region proximate to the dielectric layer. It is again to be emphasized that the three discrete layer sections of FIG. 2 are exemplary only, and FIG. 2 is provided to describe the barrier layer of the invention and to appreciate the invention.

In another embodiment, the barrier layer 20 with a concentration gradient along direction 21 as shown in FIG. 2, is formed using a chemical vapor deposition (CVD) process. Examples of CVD processes include plasma enhanced chemical vapor deposition (PECVD), low pressure chemical vapor deposition (LPCVD), and metallo-organic chemical vapor deposition (MOCVD).

For each of the CVD deposition processes, the deposition conditions can be adjusted during the course of the deposition process so that again a barrier layer is provided with a relatively high atomic concentration of a dielectric interface material in a region proximate to a dielectric layer, and a relatively high atomic concentration of a copper interface metal in a region opposite the dielectric layer. For example, the CVD process can include an inlet gas containing a dielectric interface material and another inlet gas containing a copper interface metal. In the case of MOCVD, the deposition process may include an inlet gas containing a molecular precursor containing a dielectric interface material and another inlet gas containing a molecular precursor containing a copper interface metal. The relative flow rates of the two gasses and the temperature of the substrate can be varied during the deposition process to produce the barrier layer of the invention.

2. Composite Barrier Layer

Figure 3:
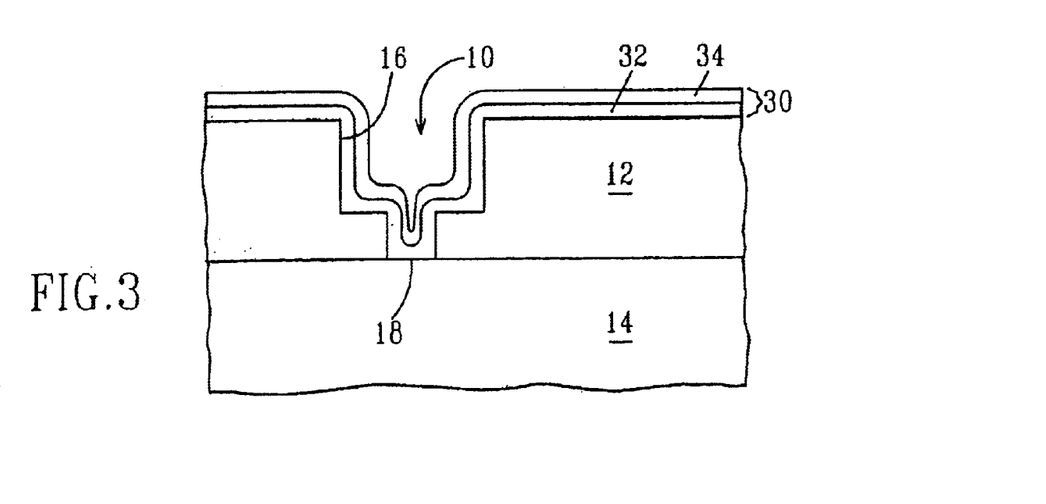
FIG. 3 is a cross-sectional view of a second embodiment of a barrier layer of the invention.

FIG. 3 shows another embodiment of the barrier layer of the invention which can be described as an extreme case of the gradient concentration embodiments of the invention. FIG. 3 shows a composite barrier layer 30 containing a lower dielectric interface material region 32 and a separately formed, upper region 34 containing a copper interface metal. Barrier layer 30 is formed over dielectric layer 12, and also within damascene opening 10. This embodiment also provides the advantages achieved by the gradient composition embodiments as it provides a barrier layer 30 with a region proximate to a dielectric layer with a relatively high atomic concentration of a dielectric interface material, and a region opposite the dielectric layer with a relatively high atomic concentration of a copper interface metal. Region 32 and region 34 can each be formed using conventional methods such as PVD, CVD, ALD, and MOCVD.

The barrier layer 30 will have a thickness of from about 0.5 nm to about 100 nm, from about 1 nm to about 25 nm, or from about 3 nm to about 15 nm. Region 32 can have a thickness 0.5 nm to about 90 nm, from about 1 nm to about 25 nm, or from about 3 nm to about 15 nm. Region 34 can have a thickness from about 0.5 nm to about 90 nm, from about 1 nm to about 25 nm, or from about 3 nm to about 15 nm.

One embodiment of the invention includes a barrier material that contains tungsten and ruthenium The barrier layer can include an approximate three region layer best depicted by FIG. 2. The region proximate to the dielectric material will contain from about 90 to 100 atom percent tungsten. The region proximate to the conducting layer will contain from about 90 to 100 atom percent ruthenium. A transition region disposed between these two layers is also provided.

Figure 6:
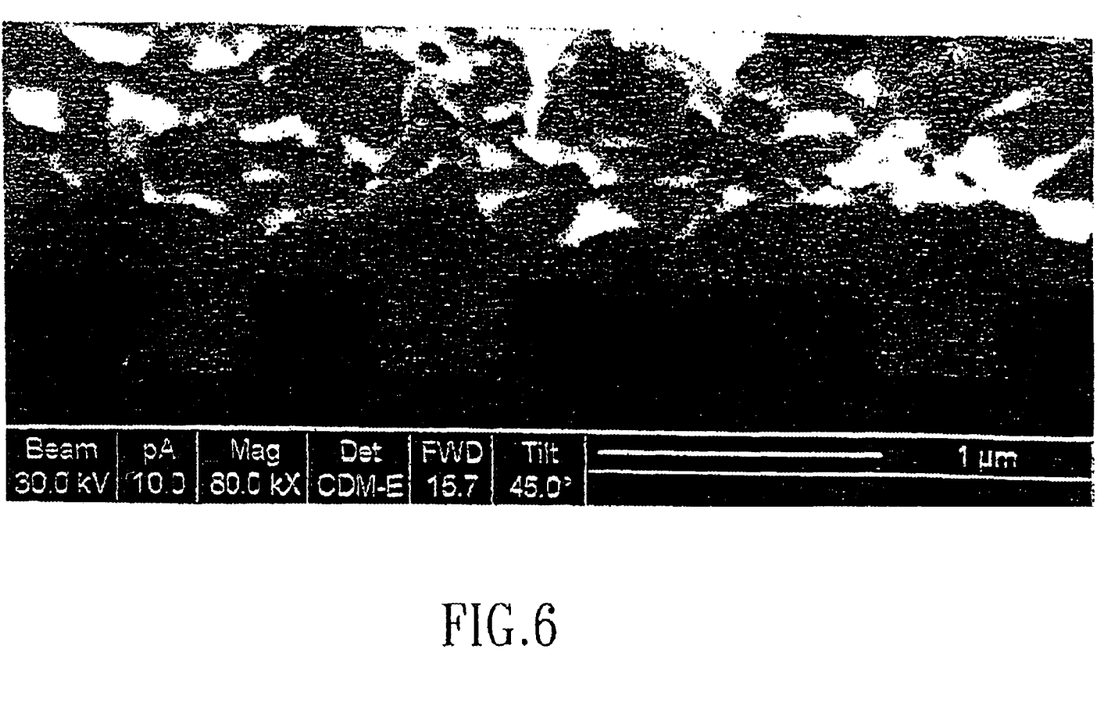
FIG. 6 is a SEM photograph of a cross-section of a damascene structure showing a tungsten/ruthenium barrier material of the invention.
Figure 7:
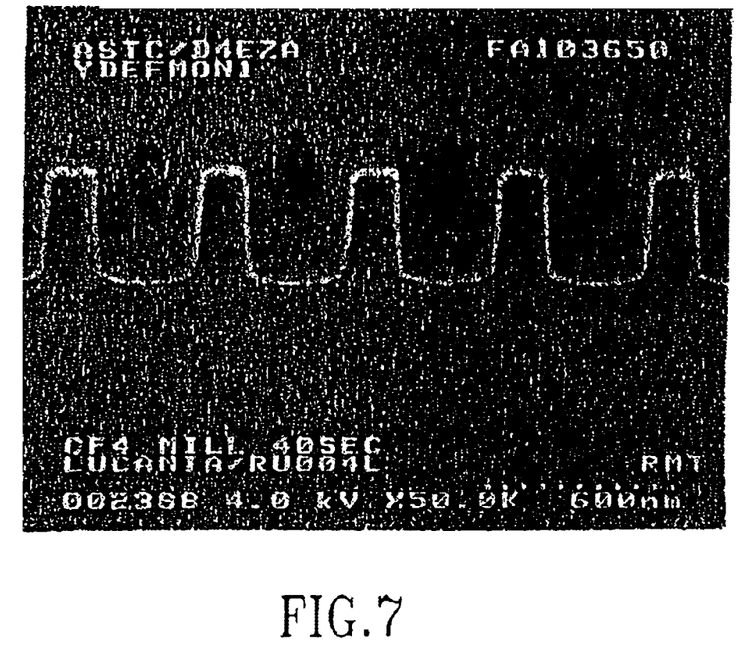
FIG. 7 is a TEM photograph showing a copper-filled damascene structure with a tungsten/ruthenium barrier material of the invention.

In another embodiment, a barrier material of the invention can approximate a two region barrier layer. For example, the barrier material shown in FIGS. 6 and 7 is a tungsten/ruthenium barrier material with about a 35 nm tungsten region proximate to the dielectric material and about a 5 nm ruthenium region proximate to the copper conducting layer (FIG. 7). The copper layer was electrodeposited without the need for a seed layer.

In one embodiment, a surface region of the barrier layer containing tungsten as the dielectric interface material, and a surface region of the barrier layer containing ruthenium is prepared by a CVD process using respective tungsten and ruthenium carbonyl precursors. The dielectric interface surface region is grown from $W(CO)_6$ on a dielectric layer of $SiO_2$ disposed on a silicon substrate. Following tungsten deposition the substrate is cooled to room temperature, and introduced into an ante-chamber of a ruthenium CVD reactor. The ante-chamber is evacuated to a pressure of approximately $10^{-3}$ torr. The substrate is heated to to remove or degas any organic contaminants in the substrate or on the surface of the substrate.

Three methods can be used to introduce the tungsten coated substrate into the Ru deposition chamber. The tungsten coated substrate can be introduced through air and without a pre-cleaning treatment, or introduced through air and inserted into a pre-cleaning chamber to remove any oxidized portion of the tungsten layer, and/or remove organic components (carbon). Well known pre-cleaning can include heating the substrate in vacuum or a sputtering treatment. The cleaned substrate is then transferred under vacuum or an inert atmosphere to the Ru deposition chamber. The third method includes introducing the tungsten coated substrate under vacuum or under an inert atmosphere to the Ru deposition chamber.

The Ru deposition chamber should be a vacuum chamber with a base pressure under operating conditions of better than $10^{-3}$ torr, preferably better than $10^{-6}$ torr and most preferably better than $10^{-7}$ torr. The reactor may be either of the hot-wall type, in which all or part of the walls of the vacuum enclosure are at least as hot as the substrate during processing with Ru. Alternatively, the cool wall type, in which the walls are substantially cooler than the substrate, can be used during processing with Ru. The chamber may be fabricated of any materials compatible with the base pressures indicated above, and the temperatures used.

After the substrate is introduced into the Ru deposition chamber, the chamber is evacuated to a pressure below about $10^{-3}$ torr, preferably below $10^{-5}$ torr, and is heated to the deposition temperature, which is in the range of 80° C. to 450° C., preferably within the range of 275° C. to 400° C. The heated substrate is then exposed to the vapor of a Ru-precursor compound that contains ruthenium. The Ru-precursor is selected from Ru carbonyls, Ru beta-diketonates, Ru aryls, and Ru alkyls. The carbonyl Ru compound $Ru_3(CO)_{12}$ is preferred.

During the Ru deposition process, a flow of inert gas, such as Ar, (1–1000 or so sccm) can be flowed through the bubbler containing the Ru compound in order to facilitate its transport to the substrate. The flux of Ru incident on the surface is controlled by adjusting the temperature of the bubbler and the flow of inert gas. Typically the flux is adjusted to achieve Ru growth on the substrate at a rate in the range of 1–200 nm/min. Total Ru thicknesses of 1–40 nm are typically used to form the barrier layers of the invention. The substrate with the completed barrier layer is cooled to room temperature, and removed from the deposition chamber for further processing as required.

One advantage of using the barrier materials of the invention is that the conductive copper layer can be directly deposited, e.g., by standard electrodeposition, without the need for a seed layer. This provides a relatively simplified procedure to fill minimum dimension lines and vias with copper or an alloy thereof. The barrier materials also provides acceptable levels, and in some cases improved, interfacial adhesion of the copper conducting layer to the barrier material.

Figure 4:
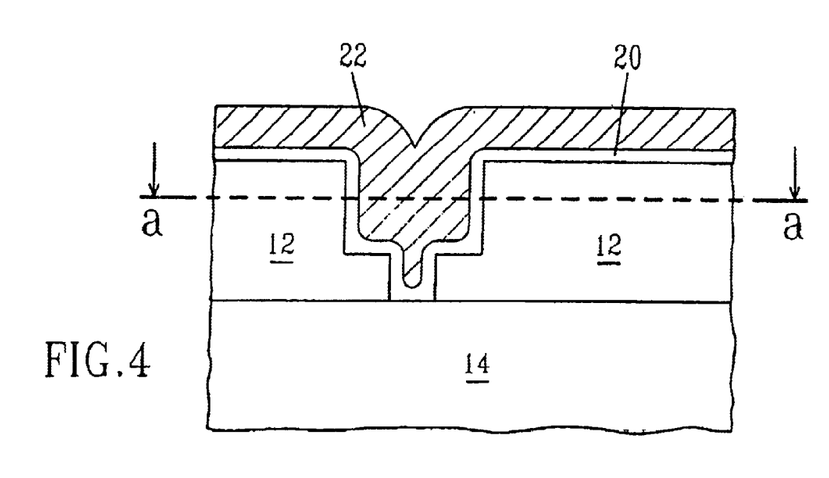
FIG. 4 is a cross-sectional view showing a conductive layer over the barrier layer of the invention.

FIG. 4 shows conductive layer 22 disposed over a barrier layer 20. Conductive layer 22 can be formed by CVD, PVD, electrodeposition, electroplating or electroless plating processes. The conductive layer 22 deposited over barrier layer 20 of the invention can be formed of copper or an alloy thereof. Also, it is preferred that conductive layer 22 completely fill the remainder of opening 10 following deposition of barrier layer 20. By filling opening 10, it is meant that conductive layer 22 occupies that portion of opening 10 below the plane formed by an upper surface of dielectric layer 12.

In one embodiment, the semiconductor structure of the invention contains a barrier layer that comprises a gradient atomic concentration of the dielectric interface material with a relatively high atomic concentration of the dielectric material proximate to the dielectric layer. Preferably, the barrier layer contains a region proximate to the dielectric containing at least about 50 atom percent of the dielectric interface material. Also, it is preferred that the barrier layer contain a region proximate to a conducting material with at least about 50 atom percent of the copper interface metal. The preferred conducting material is copper or an alloy thereof.

A semiconductor structure that includes a barrier layer of the invention will contain a copper interface metal selected from the group consisting of ruthenium, rhodium, palladium, silver, gold, platinum, iridium, selenium, tellurium, and alloys thereof. The preferred copper interface metals are selected from the group consisting of ruthenium, rhodium, and palladium.

The semiconductor structure that includes barrier layer of the invention will also contain a dielectric interface material selected from the group consisting of tungsten, tungsten nitride, titanium, titanium nitride, tantalum, tantalum nitride, rhenium, and rhenium silicides. The preferred dielectric interface material is selected from the group consisting of tungsten and a tungsten alloy.

The barrier material of the invention, though not necessary, can be used in conjunction with a seed layer. In such an embodiment, the conductive layer 22 is formed by electrodeposition using a seed layer disposed between barrier layer 20 and conductive layer 22. The seed can be formed using conventional CVD, PVD, or ALD methods known in the art or it may be formed using electroless plating processes. The seed layer is disposed over a top surface of barrier layer 20 and does not completely fill opening 10. The seed layer is preferably formed of copper.

The electroless copper plating processes that can be used to fill the damascene structure above the barrier material of the invention are described in U.S. Pat. Nos. 5,997,997 and 5,846,598, the disclosures of which are incorporated herein by reference.

In a preferred embodiment of the invention, the conducting layer 22 is deposited directly onto the surface of a barrier layer of the invention in a direct electrodeposition process, that is, without the need for a seed layer. The process of the invention includes deposition of an insulating material on a wafer, lithographically defining and forming submicron trenches or holes in the insulating material into which the conducting layer is deposited to form lines or vias, depositing the conductor by direct electrodeposition of copper or a copper alloy, and planarizing or chemical mechanical polishing the resulting structure to provide electrical isolation of the individual lines and/or vias.

The conducting layer 22 can include small amounts of a material in the Cu selected from the group consisting of carbon (less than 2 weight percent), oxygen (less than 1 weight percent), nitrogen (less than 1 weight percent), sulfur (less than 1 weight percent), and chlorine (less than 1 weight percent).

The conducting layer can be electrodeposited using electroplating baths common to the semiconducting manufacturing process. The baths can contain additives conventionally used to produce bright, level, low-stress deposits. The electroplating process can provide a conducting layer with unique superfilling properties that results in void-free, seamless deposits.

Copper plating from solutions containing additives can be used to produce level deposits on a rough surface can be used to accomplish superfilling required to fill sub micron cavities. One suitable system of additives is the one marketed by Enthone-OMI, Inc., of New Haven, Conn. and is known as the SelRex Cubath M system. The above additives are referred to by the manufacturer as MHy. Another suitable system of additives is the one marketed by LeaRonal, Inc., of Freeport, N.Y., and is known as the Copper Gleam 2001 system. The additives are referred to by the manufacturer as Copper Gleam 2001 Carrier, Copper Gleam 2001-HTL, and Copper Gleam 2001 Leveller. And another suitable system of additives is the one marketed by Atotech USA, Inc., of State Park, Pa., and is known as the Cupracid HS system. The additives in this system are referred to by the manufacturer as Cupracid Brightener and Cupracid HS Basic Leveller.

Examples of specific additives which may be added to a bath in the instant invention are described in several patents. U.S. Pat. No. 4,110,176, entitled l'Electrodeposition of Copper" describes the use of additives to a plating bath such as poly alkanol quaternary-ammonium salt which formed as a reaction product to give bright, highly ductile, low stress and good leveling copper deposits from an aqueous acidic copper plating bath which patent is incorporated herein by reference. U.S. Pat. No. 4,376,685, the disclosure of which is incorporated herein by reference, describes additives to a plating bath such as alkylated polyalkyleneimine which formed as a reaction product to provide bright and leveled copper electrodeposits from an aqueous acidic bath. U.S. Pat. No. 4,975,159, describes adding to an aqueous acidic bath combinations of organic additives including at least one substituted alkoxylated lactam as an amide-group-containing compound in an amount to optimize the brightness and ductility of the deposited copper.

Table 1 of U.S. Pat. No. 4,975,159 lists a number of alkoxylated lactams which may be added to a bath in the instant invention. Table II lists a number of sulfur-containing compounds with water-solubilizing groups such as 3 mercaptopropane-1-sulfonic acid which may be added to a bath in the instant invention. Table III lists organic compounds such as polyethylene glycol which may be added to a bath as surfactants in the instant invention.

U.S. Pat. No. 3,770,598, the disclosure of which is incorporated herein by reference, describes baths for obtaining ductile, lustrous copper containing therein dissolved a brightening amount of the reaction product of polyethylene imine and an alkylating agent to produce a quaternary nitrogen, organic sulfides carrying at least one sulfonic group, and a polyether compound such as polypropylene glycol.

U.S. Pat. No. 3,328,273, the disclosure of which is incorporated herein by reference, describes copper sulfate and fluoborate baths for obtaining bright, low-stress deposits with good leveling properties that contain organic sulfide compounds of the formula XR1-(Sn)-R2-SO3H, where R1 and R2 are the same or different and are polymethylene groups or alkyne groups containing 1–6 carbon atoms, X is hydrogen or a sulfonic group, and n is an integer of S 2-S inclusive. Additionally these baths may contain polyether compounds, organic sulfides with vicinal sulphur atoms, and phenazine dyes. In U.S. Pat. No. 3,328,273, Table I lists a number of polysulfide compounds which may be added to a bath in the instant invention. Table II lists a number of polyethers which may be added to a bath in the instant invention.

Additives can be added to the bath for accomplishing various objectives. The bath may include a copper salt and a mineral acid. Additives can be included for inducing in the conductor specific film microstructures including large grain size relative to film thickness or randomly oriented grains. Also, additives can be added to the bath for incorporating in the conductor material molecular fragments containing atoms selected from the group consisting carbon, oxygen, nitrogen, sulfur and chlorine to enhance electromigration resistance over pure Cu. Furthermore, additives may be added to the bath for inducing in the conductor specific film microstructures including large grain size relative to film thickness or randomly oriented grains, whereby the electromigration behavior is enhanced over non electroplated Cu.

The barrier materials of the invention, and possibly the elimination of a seed layer, provide an electrodeposited copper conducting layer with less than 40% of Cu grains by volume having a (111) crystallographic orientation. In fact, in the majority of cases the barrier materials provide an electrodeposited copper conducting layer with less than 30% of Cu grains by volume having a (111) crystallographic orientation. Yet still, in some cases the barrier materials provide an electrodeposited copper conducting layer with less than 20% of Cu grains by volume having a (111) crystallographic orientation. The observation in crystallographic orientation is quite surprising because TaN/Ta barrier layers with a Cu seed layer normally contain an electrodeposited copper layer with at least 60% of Cu grains by volume having a (111) crystallographic orientation.

The degree of crystallographic orientation, or texture, is determined by x-ray diffraction techniques. A crystalline material may be arranged in a monolithic, single-crystal, structure or in a collection of many crystals or grains, usually between 0.1 $\mu$m and 10 $\mu$m in size. The relative orientation of the individual grains within the latter arrangement, defined as a polycrystalline material, can span the range from a random distribution to one in which the grains are highly correlated. The measure of the correlation of the relative orientation of the grains is referred to as texture.

The atomic arrangement within a grain follows a periodic structure based on a unit cell configuration, within which planes of atoms exist. In thin films, it is often important to determine the degree of texture of certain atomic planes that are parallel to the plane of the substrate. The close-packed planes, those which possess the greatest atomic density, in Cu are defined as (111). The texture of (111) grains greatly affects the properties of a polycrystalline Cu aggregate, such as mechanical stiffness and atomic diffusion. Several factors, such as deposition temperature and the deposition surface, can affect the resultant (111) texture in Cu films during its manufacture.

Through x-ray diffraction, the fraction of (111) grains in a polycrystalline Cu film that are oriented parallel to the substrate relative to a random distribution can be quantified. A brief description of an x-ray texture measurement is as follows. When a monochromatic x-ray beam impinges on the Cu film, diffracted intensity is produced and measured at specific orientations using an x-ray detector. The strength of the diffracted intensity can be correlated to the degree of texture in the film, which is tilted and rotated over a range of orientations. An analysis of the area of the (111) diffraction peak as a function of the tilt angle with respect to the substrate normal reveals the average cyrystallographic orientation within the Cu film. The fraction of Cu grains having a (111) crystallographic orientation is calculated by measuring the height and breadth of the (111) diffraction peak, after background subtraction and intensity normalization, about the tilt angle of zero. The fraction of Cu grains having a (111) crystallographic orientation can run from a minimum of 0% to a maximum of 100% by volume, corresponding to completely random texture to perfect (111) texture.

Figure 8:
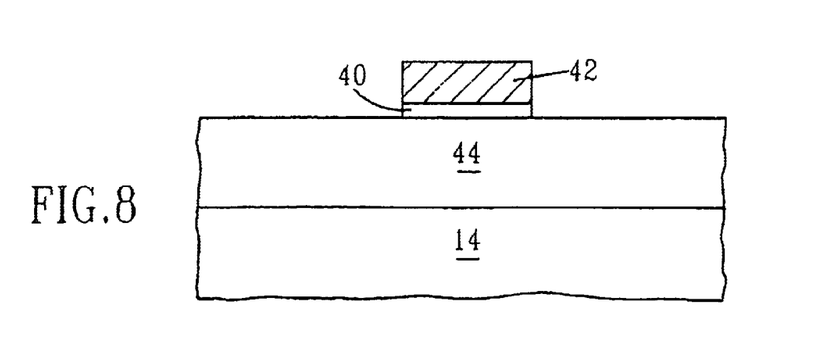
FIG. 8 is a cross-sectional view showing an embodiment of a patterned conductive structure including the barrier layer of the invention in a non-damascene application.

FIG. 8 shows another embodiment of a barrier layer 40 of the invention and a conductive layer 42 disposed over a dielectric layer 44 in a semiconductor structure utilizing non-damascene processing. The barrier layer 40 can be characterized as a gradient concentration barrier layer as shown and described in FIGS. 1 and 2, or as a barrier layer with upper and lower regions shown and described in FIG. 3. In this non-damascene structure, aluminum and nickel are the preferred conductive materials, though copper can also be used.

Figure 5:
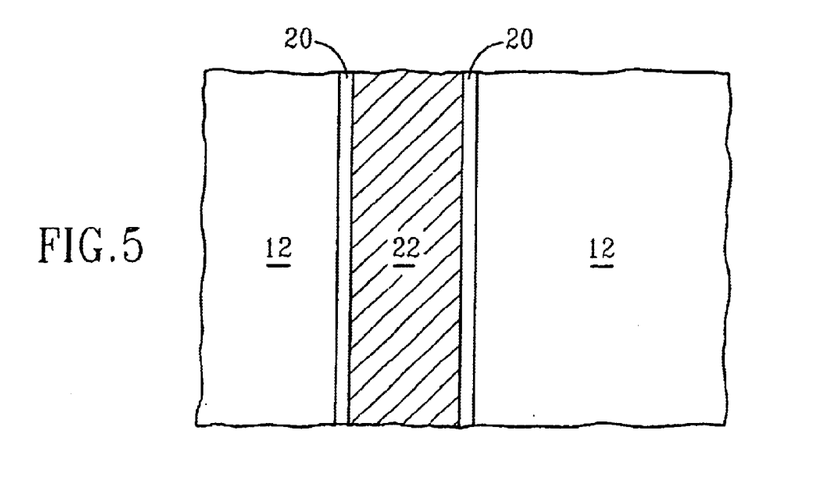
FIG. 5 is a cross-sectional view of FIG. 4 cut along aa showing how a filled trench structure can be represented by one or more layers of different materials.

The term "layer" as used herein is defined as a sequential arrangement of materials used in a composite structure that are arranged in any direction, and is not limited to flat, horizontal structures. For example, a trench filled with a sequential arrangement of materials is a composite structure defined by one or more layers. FIG. 5, which is a representation of FIG. 4 along cut aa, shows a layered composite structure of a trench formed from a dielectric layer 12 filled with a barrier layer 20 of the invention and a conducting layer 22.

It is to be understood that the invention is not intended to be limited to the embodiments shown and described. Rather, the barrier layer of the invention can be used in any application in which a barrier layer is needed. In addition to being disposed within a trench opening as is done with damascene processing, the barrier layer can be used in other applications as well. The barrier layer and the structures formed using the barrier layer, can be utilized in various semiconductor structures, and can be disposed over various substrates and materials used in the semiconductor manufacturing industry.

This invention will be better understood with reference to the following examples, which are intended to illustrate specific embodiments within the overall scope of the invention as claimed.

EXAMPLE 1

Barrier materials utilizing tungsten as the dielectric interface material and rhodium or palladium as the copper interface metal are prepared as follows. A dielectric material is placed in a PVD sputtering chamber. A layer of tungsten is deposited on the dielectric material, followed by a layer of palladium or rhodium. These materials are best described as two region barrier materials and are provided in Table 1.

TABLE 1

| Material | W (nm) | Pd (nm) | Rh (nm) |
|---|---|---|---|
| A | 45 | 5 | — |
| B | 45 | — | 5 |

EXAMPLE 2

Barrier materials utilizing tungsten as the dielectric interface material and rhodium or palladium as the copper interface metal are prepared as follows. A dielectric material is placed in a PVD sputtering chamber. A dual-deposition PVD sputtering procedure is used to deposit an alloyed barrier material containing tungsten and rhodium or palladium. The atomic percent of these metals in the barrier materials is controlled by adjustment of power supplied to each respective sputtering target. These materials are best described as a single region alloyed, barrier materials, and are provided in Table 2.

TABLE 2

| Material | W (atom %) | Pd (atom %) | Rh (atom %) |
|---|---|---|---|
| c | 25 | 75 | — |
| d | 15 | 85 | — |
| e | 5 | 95 | — |
| f | 25 | — | 75 |
| g | 15 | — | 85 |
| h | 5 | — | 95 |

EXAMPLE 3

Barrier materials utilizing tungsten as the dielectric interface material and rhodium or palladium as the copper interface metal are prepared as follows. A dielectric material is placed in a PVD sputtering chamber. Initially, tungsten is deposited on the dielectric material, followed by the co-deposition of tungsten and rhodium or palladium to form a transition region of the barrier layer. The atomic percent of these metals in the transition region is controlled by adjustment of power supplied to each respective sputtering target. The rhodium or palladium is then deposited on the transition region. These materials are best described as three-region barrier materials, and are provided in Table 3.

TABLE 3

| Material | W (nm) | W/Rh (nm) | W/Pd (nm) | Rh (nm) | Pd (nm) |
|---|---|---|---|---|---|
| i | 20 | 10 | — | 20 | — |
| j | 20 | — | 10 | — | 20 |
| k | 40 | 5 | — | 5 | — |
| l | 40 | — | 5 | — | 5 |

EXAMPLE 4

Barrier materials utilizing tungsten as the dielectric interface material and rhodium or palladium as the copper interface metal are prepared as follows. A dielectric material is placed in a PVD sputtering chamber. Initially, tungsten is deposited on the dielectric material, followed by the co-deposition of rhodium or palladium using a dual-deposition procedure. The atomic percent of these metals in this region is controlled by adjustment of power supplied to each respective sputtering target. These materials are best described as two region barrier materials with tungsten as the dielectric interface material and tungsten/rhodium or tungsten/palladium alloys as the copper interface metal. The atomic percent of tungsten in the alloys is about 50%. These materials are provided in Table 4.

TABLE 4

| Material | W (nm) | W/RH (nm) | W/Pd (nm) |
|---|---|---|---|
| m | 48 | 2 | — |
| n | 48 | — | 2 |
| o | 49 | 1 | — |
| p | 49 | — | 1 |

EXAMPLE 5

A surface region of the barrier layer containing ruthenium over tungsten is prepared in a cold-wall type reactor, constructed from stainless steel with metal gasket seals throughout. Pressures of better than $10^{-8}$ torr can be obtained in the reactor. A tungsten coated substrate is introduced to the reactor and heated to a temperature of 380° C. by means of a resistive boron nitride heater. At selected deposition temperature, a valve is opened that allows a vapor of $Ru_3(CO)_{12}$, contained within a flow of 5 sccm Ar to contact the surface of the substrate. The pressure in the deposition chamber is approximately 10 mtorr during this process. Growth of the Ru layer is continued for 5 min to produce a Ru layer approximately 20 nm thick. The flow of $Ru_3(CO)_{12}$ is stopped by closing the valve and the chamber evacuated to about $10^{-5}$ torr. The substrate with the completed barrier layer is transferred under vacuum to an ante-chamber, and cooled to room temperature.

What is claimed is:

1. A process for forming a conducting layer in a semiconductor structure comprising:

providing a dielectric layer disposed on an underlayer;

providing a barrier layer disposed on the dielectric layer, wherein the barrier layer comprises a dielectric interface surface region, and a copper interface surface region with at least 50 atom percent of a copper interface metal; and depositing a conducting layer onto copper interface surface region of the barrier layer, wherein depositing the conducting layer comprises direct electrodeposition of copper or an alloy thereof, and the conducting layer containing copper contains less than 40% copper grains by volume with (111) cryallographic orientation.

2. The process of claim 1 wherein the copper interface metal is selected from the group consisting of ruthenium, rhodium, palladium, silver, gold, platinum, iridium, selenium, tellurium, and alloys thereof.

3. The process of claim 1 wherein the copper interface metal is selected from the group consisting of ruthenium, rhodium, and palladium.

4. The process of claim 1 further comprising forming damascene openings or dual-damascene openings with sidewalls and a bottom surface in the dielectric layer prior to contacting the barrier layer to the dielectric layer.

5. The process of claim 1 wherein the barrier layer comprises a region with a gradient atomic concentration of dielectric interface material.

6. The process of claim 1, wherein the barrier layer includes a region proximate to the dielectric layer with at least 50 atom percent of the dielectric interface material.

7. The process of claim 1, wherein the dielectric interface material is selected from the group consisting of tungsten, tungsten nitride, titanium, titanium nitride, tantalum, tantalum nitride, rhenium, and rhenium silicides.

8. The process of claim 1, wherein depositing a conducting layer by direct electrodeposition includes placement of the semiconductor structure with in an electroplating bath containing copper and an additive.

9. The process of claim 1, wherein the conducting layer containing copper contains less than 20% copper grains by volume with a (111) crystallographic orientation.

10. The process of claim 1, further comprising providing a seed layer disposed on the barrier layer prior to depositing the conducting layer.

11. A Process for forming a copper interconnect structure on an electronic device comprising:

forming a dielectric layer on an underlayer, forming damascen openings or dual-damascene openings defined by submicron lines in the dielectric layer, wherein the damascene openings or dual-damascene openings have sidewalls and a bottom surface;

forming a barrier layer with gradient atomic concentration of a dielectric interface material on the sidewalls and the bottom surface, wherein the barrier layer comprises a dielectric interface surface region, and a copper interface surface region with at least 50 atom percent of a copper interface metal;

depositing a conductor layer containing copper or an alloy thereof by direct electrodeposition on the copper interface surface region, wherein the conducting layer contains less than 40% copper grains by volume with a (111) crystallographic orientation; and planarizing the resulting structure to electrically isolate the copper interconnect structure.

12. The process of claim 11, wherein the conducting layer containing copper contains less than 20% copper grains by volume with a (111) crystallographic orientation.

13. The process of claim 11, wherein the copper interface metal is selected from the group consisting of ruthenium, rhodium, palladium, silver, gold, platinum, iridium, selenium, tellurium, and alloys thereof.

14. The process of claim 11, wherein the barrier layer includes a region proximate to the dielectric layer with at least 50 atom percent of the dielectric interface material.

15. The process of claim 11, wherein the dielectric interface material is selected from the group consisting of tungsten, tungsten nitride, titanium, titanium nitride, tantalum, tantaium nitride, rhenium, and rhenium sillicides.

* * * * *